US006429455B1

(12) United States Patent
McNeil et al.

(10) Patent No.: US 6,429,455 B1
(45) Date of Patent: Aug. 6, 2002

(54) METHOD TO ENHANCE THE FORMATION OF NUCLEATION SITES ON SILICON STRUCTURES AND AN IMPROVED SILICON STRUCTURE

(75) Inventors: Vincent Maurice McNeil, Dallas; Jorge Adrian Kittl, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/397,462

(22) Filed: Sep. 16, 1999

Related U.S. Application Data

(62) Division of application No. 09/225,881, filed on Jan. 5, 1999.
(60) Provisional application No. 60/070,504, filed on Jan. 6, 1998.

(51) Int. Cl.[7] .................................................. H01L 29/04
(52) U.S. Cl. .................... 257/49; 257/763; 257/764; 257/770; 257/384; 257/388; 257/412; 438/583; 438/649; 438/655; 438/685; 438/683
(58) Field of Search ......................... 257/407–413, 257/757, 763, 764, 770, 49, 384, 388; 438/585, 587, 592, 583, 649, 655, 685, 683

(56) References Cited

U.S. PATENT DOCUMENTS

| 4,735,680 A | | 4/1988 | Yen ............................ 156/643 |
| 5,196,360 A | | 3/1993 | Doan et al. ................... 437/41 |
| 5,828,131 A | * | 10/1998 | Cabral, Jr. et al. .......... 257/757 |
| 5,994,210 A | * | 11/1999 | Kerr ............................. 438/592 |
| 6,015,997 A | * | 1/2000 | Hu et al. ..................... 257/412 |
| 6,046,105 A | * | 4/2000 | Kittle et al. ................. 438/655 |

FOREIGN PATENT DOCUMENTS

| EP | 812 009 A2 | * | 12/1997 |
| EP | 0 812 009 A2 | * | 12/1997 |

OTHER PUBLICATIONS

Lim et al, "Monitoring of TiSi2 formation on narrow polycrystalline silicon lines using Raman Spectroscopy" IEEE Electron Device Letters, vol. 19, No. 5, May 1998.*
J Digregorio, "Small Area Versus Narrow Line Width Effects on the C49 to C54 Transformation of TiSi2" IEEE Transactions on Electron Devices, vol. 47, No. 2, Feb. 2000.*

* cited by examiner

*Primary Examiner*—Nathan J. Flynn
*Assistant Examiner*—Ahmed N. Sefer
(74) *Attorney, Agent, or Firm*—Peter K. McLarty; W. James Brady, III; Frederick J. Telecky, Jr.

(57) ABSTRACT

A method to enhance the formation of nucleation sites on at least one narrow silicon structure comprises the step: forming at least one nucleation region (206/208): masking the at least one narrow silicon structure (202) with a mask (302); treating the at least one nucleation region (206/208) to enhance an ability of said region to form C54 nucleation sites; and removing the mask from the at least one narrow silicon structure (202). In another embodiment, a silicon device capable of undergoing a phase transformation comprises at least one narrow silicon structure (202) formed of $TiSi_2$; and at least one nucleation region (206/208) attached to the at least one narrow silicon region (202), said at least one nucleation region (206/208) having a width which is greater than a width of said at least one narrow silicon structure (202) and said at least one nucleation region (206/208) capable of generating a high density of C54 nucleation sites such that said high density of nucleation sites causes a phase transformation (502a/502b) to propagate along the at least one silicon structure (202).

4 Claims, 2 Drawing Sheets

METHOD TO ENHANCE THE FORMATION OF NUCLEATION SITES ON SILICON STRUCTURES AND AN IMPROVED SILICON STRUCTURE

CROSS REFERENCE TO PRIOR APPLICATIONS

This application is a division of application Ser. No. 09/225,881 filed Jan. 5, 1999, and claiming priority based upon Provisional Application No. 60/070,504 filed Jan. 6, 1998.

TECHNICAL FIELD OF THE INVENTION

This invention relates generally to the field of semiconductor devices and more particularly to a method for forming nucleation sites on silicon structures and an improved silicon structure.

BACKGROUND OF THE INVENTION

Titanium disilicide ($TiSi_2$) is commonly used as a salicide (Self-Aligned siLICIDE) material in state-of-the-art CMOS device processes. The salicide process is a key step in reducing the sheet resistance of the small dimension gate and source and drain (S/D) regions of a device. Keeping the sheet resistance of these regions low is critical to the operation of high performance CMOS devices and integrated circuits.

At the heart of the standard salicide process using $TiSi_2$ is the formation of the C49 phase $TiSi_2$ (i.e., high resistance state) from deposited titanium (Ti) and the subsequent transformation of this silicide to C54 phase $TiSi_2$ (i.e., low resistance state). Traditionally, the formation is achieved with a second anneal following selective removal of unreacted Ti and titanium nitride (TiN).

In more detailed terms, a layer of Ti is deposited over the semiconductor structure. The layer is then subjected to a process to form a layer of C49 phase $TiSi_2$, for example, an annealing process. When an annealing process is used, it is typically performed in a nitrogen ambient, so that the remaining non-silicided material is either unchanged or forms a metal nitride. A wet etch may then be used to selectively remove the non-silicided metal.

In the case of Ti, a solution of $H_2O_2$ and $H_2O$ may be used to wet etch the TiN which is formed during the annealing process, thus, leaving a layer of C49 phase $TiSi_2$. To initiate the C49 to C54 transformation, a second anneal is performed. To successfully transform, however, a sufficient number of C54 nucleation sites must be present in the $TiSi_2$. If not enough sites are present, then there will be incomplete transformation of the silicide for the given anneal conditions.

This C49 to C54 nucleation phenomenon manifests itself in the "poly linewidth effect" where it is observed that it becomes increasingly more difficult to form low sheet resistance (C54 phase) $TiSi_2$ on polysilicon lines having a width of less than about 1 μm. As the dimensions of the gate shrink below this width, fewer and fewer C54 nucleation sites exist that can aid in the C49 to C54 transformation (e.g., when the dimension of the structure to be silicided is of the same order or smaller than the average distance between C54 nuclei).

This problem has been partially solved by introducing more C54 nucleation sites into the narrow polysilicon or silicon regions using ion implantation to "roughen" by damaging the surface of the material to be silicided. This approach, referred to as PAI (Pre-Amorphization Implantation), has been successfully demonstrated as being usable to obtain low sheet resistance $TiSi_2$ on narrow (<0.25 μm) polysilicon lines. However, this approach suffers from the problem that the roughening/damaging created extends beyond the surface of the silicon and into the S/D regions of the device leads to increased diode junction leakage which degrades overall device performance.

SUMMARY OF THE INVENTION

Accordingly, a need has arisen for a method for forming nucleation sites on silicon structures without introducing damage or metallic impurities into the underlying or adjacent silicon S/D regions. Also, a need has arise for an improved silicon structure. According to the teachings of the present invention, such a method and improved silicon structure are provided that address the disadvantages and problems associated with previous methods for forming nucleation sites on silicon structures and previous silicon structures.

A method to enhance the formation of nucleation sites on at least one narrow silicon structure comprises the steps of: forming at least one nucleation region adjacent the narrow silicon structure; masking the at least one narrow silicon structure with a mask; treating the at least one nucleation region to enhance an ability of the nucleation region to form C54 nucleation sites; and removing the mask from the at least one narrow silicon structure.

In another embodiment, a method for forming a low resistance silicide layer on an integrated circuit comprises: forming a first oxide layer over a semiconductor body; depositing a polysilicon layer over the first oxide layer; selectively etching the polysilicon layer and the first oxide layer to form at least one silicon structure and at least one nucleation region attached to the at least one silicon structure, the at least one nucleation region having a width which is greater than a distance separating C54 nuclei; siliciding the at least one silicon structure and the at least one nucleation region to form a layer of C49 phase silicide; and annealing the C49 phase silicide to form C54 phase silicide.

In still another embodiment, a semiconductor device capable of undergoing a phase transformation comprises: at least one narrow silicon structure; and at least one nucleation region attached to the at least one narrow silicon structure, the at least one nucleation region having a width which is greater than a width of the at least one narrow silicon structure and the at least one nucleation region capable of generating a high density of C54 nucleation sites such that the high density of C54 nucleation sites causes a phase transformation to propagate along the at least one silicon structure.

A technical advantage of the present invention is that a method for forming nucleation sites on silicon structures is provided. Another technical advantage is that a semiconductor device capable of undergoing a phase transformation is provided. Another technical advantage is that at least one nucleation region is used to induce the formation of localized nucleation sites. Another technical advantage is that a single nucleation region may be used to form nucleation sites on a plurality of narrow silicon structures. Another technical advantage is that more than one nucleation region may be used to form nucleation sites on an elongate silicon structure. Another technical advantage is that low resistance C54 state $TiSi_2$ may be formed on narrow silicon structures. Another technical advantage is that pre-amorphization implantation may be used to induce the formation of nucleation sites without damaging the active area of the device. Another technical advantage is that the introduction of refractory metals, for example, Mo, Ta and W, may be used to induce the formation of nucleation sites without damaging the active area of the device. Another technical advantage is that a method of transforming C49 phase silicide into C54 phase silicide is provided without the introduction of metallic impurities or other defects and damage into the S/D regions that may lead to higher diode junction leakage in the device being formed.

Other technical advantages will be readily apparent to one skilled in the art from the following figures, descriptions, and claims.

BRIEF DESCRIPTION OF THE DRAWINGS

For a more complete understanding of the present invention, and some of the advantages thereof, reference is now made to the following descriptions taken in connection with the accompanying drawings in which.

DETAILED DESCRIPTION OF THE INVENTION

The embodiments of the present invention and their advantages are best understood by referring to FIGS. 1 through 6 of the drawings, like numerals being used for like and corresponding parts of the various drawings.

Figure 1:
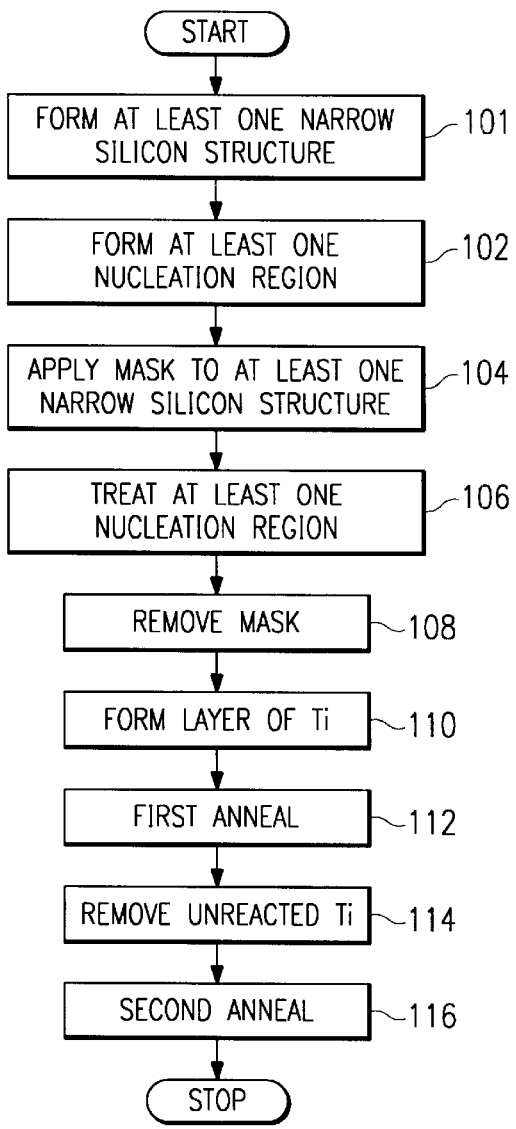
FIG. 1 is a flowchart representing the process according to the present invention.

FIG. 1 presents a flowchart depicting the method for forming localized nucleation sites in a narrow silicon structure in accordance with one embodiment of the invention. In step 101, at least one narrow silicon structure, such as a narrow polysilicon gate, a silicon moat, or a polyline, is formed. In step 102, at least one nucleation region is formed adjacent to the at least one narrow silicon structure. Steps 101 and 102 may be accomplished with the same semiconductor process. For example, steps 101 and 102 may comprise forming a first oxide layer (not shown) over a semiconductor body (not shown), depositing a polysilicon layer (not shown) over the first oxide layer, and selectively etching the polysilicon layer and the first oxide layer to form at least one narrow silicon structure and at least one nucleation region attached to said at least one silicon structure.

The width of the at least one narrow silicon structure may be less than 0.25 μm. The at least one nucleation region may have about the same or greater width than the width of the at least one narrow silicon structure. Typically, the width of the nucleation regions may be at least 0.25 μm. While larger nucleation regions may be preferred, the ability to use wide nucleation regions may be limited by layout design rules, effectively limiting the maximum width of the nucleation regions to the space that is available. The narrow silicon structures and the nucleation regions are formed of silicon.

The number of nucleation regions that are attached to the narrow silicon structure may depend on the length of the narrow silicon structure. While one nucleation region will often work, a plurality of nucleation regions may be used. In one embodiment, if the narrow silicon structure has a length of greater than or equal to 20 μm, it may be desirable to add a second nucleation region in order to effect a quicker transformation from C49 to C54 phase $TiSi_2$ over the length of the narrow silicon structure. However, the addition of a second nucleation region is not required.

Figure 2A:
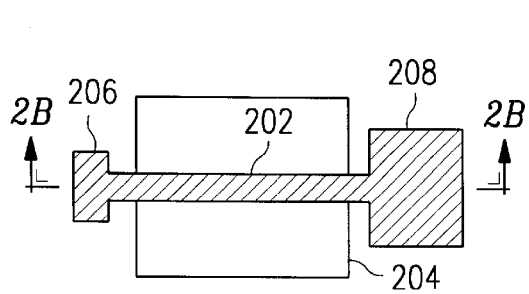
FIG. 2A represents an overhead view of a silicon structure prior to masking.
Figure 2B:
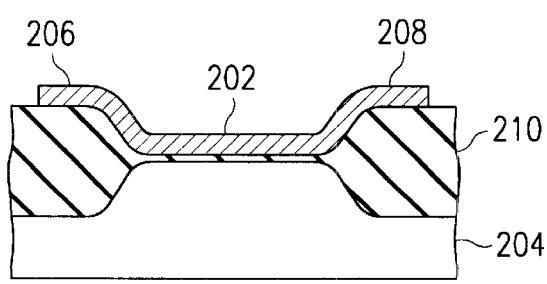
FIG. 2B represents a view of the silicon structure in FIG. 2A taken along the 2B—2B cut indicated in FIG. 2A.

Referring to FIGS. 2A and 2B, hammerhead 206 and contact pad 208, both nucleation regions, are attached to silicon gate 202. Hammerhead 206 and contact pad 208 are located on top of isolation region 210 and do not directly touch moat 204. FIG. 2B, which is a view taken along the 2B—2B cut of FIG. 2A, illustrates the positioning of hammerhead 206 and contact pad 208. Hammerhead 206 and contact pad 208 may be of the same dimension, or they may be of different dimensions.

Figure 3A:
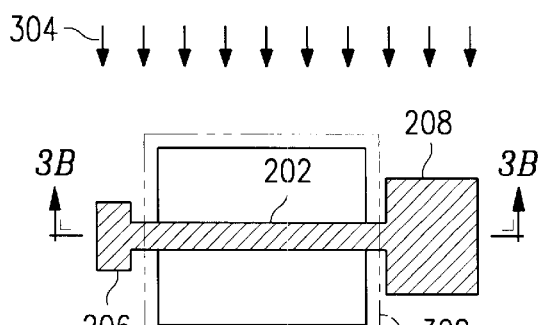
FIG. 3A represents an overhead view of a masked silicon structure undergoing nucleation site implantation.
Figure 3B:
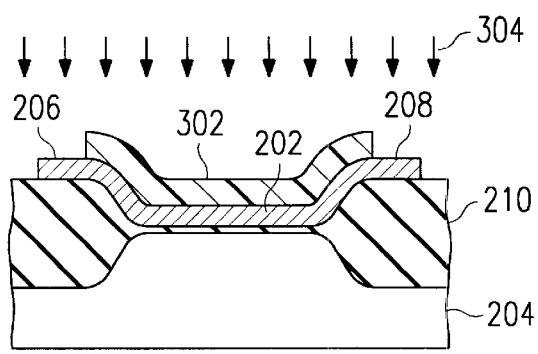
FIG. 3B represents a view of the silicon structure in FIG. 3A taken along the 3B—3B cut indicated in FIG. 3A.

Referring again to FIG. 1, in step 104, a mask is applied in order to cover moat 204 and silicon gate 202, i.e., the active area. Applying a mask to a silicon structure is known in the art. Standard lithography techniques using photoresists or other organic or inorganic masks, including $SiO_2$, may be used. The nucleation regions are not covered by the mask and thus remain exposed. In step 106, the attached nucleation regions are treated in a fashion that enhances the formation of C54 nucleation sites. Referring to FIGS. 3A and 3B, mask 302 covers silicon gate 202 and moat 204, while hammerhead 206 and contact pad 208, both nucleation regions, are uncovered and exposed.

Referring to FIG. 1, in step 106, the semiconductor structure is treated to enhance formation of C54 nucleation sites during silicidation. This treatment may be accomplished by any method that will enhance the subsequent formation of C54 nucleation sites. In one embodiment, the treatment comprises a PAI treatment using Sb, In, As, B, C, Si, Ge, N, or Ar, for example, at energies between 5 and 50 KeV and doses of $5 \times 10^{12}$ to $5 \times 10^{15}$ ions/cm². A typical PAI may be effected at an energy of about 20 to 50 KeV and at a dose of $3 \times 10^{14}$ to $3 \times 10^{15}$. The PAI treatment will produce a thin amorphous silicon layer which may, for example, range between 15 to 50 nanometers in thickness, with a typical thickness being around 30 nanometers. In another embodiment, the treatment may introduce refractory metals into a surface of the nucleation regions using implantation, sputter deposition, chemical vapor deposition, or other techniques. Refractory metals may include, without limitation, Mo, Ta, and W. Implantation of refractory metals may be effected at an energy of about 20 to 60 KeV and at a dose of $1 \times 10^{13}$ to $5 \times 10^{14}$ ions/cm². Step 106 treats the silicon that comprises the nucleation regions. As a result, when the nucleation regions are silicided at a subsequent step, the silicidation process is able to more effectively achieve a C49 to C54 phase transformation.

Referring to FIGS. 3A and 3B, treatment 304 is applied to the entire structure. However, due to mask 302 protecting silicon gateway 202, treatment is effectively applied only to hammerhead 206 and contact pad 208. As a result of treatment 304, hammerhead 206 and contact pad 208 have an enhanced ability to undergo a phase transformation from C49 phase TiSi$_2$ to C54 phase TiSi$_2$ during subsequent processing steps. At the time of treatment 304, no titanium has yet been deposited, and so, it is only polysilicon that is being treated. Because no titanium has yet been deposited, no transformation can occur, but rather the transformation is effected during subsequent processing stages, as will be discussed below. Treatment 304 is used only to enhance the ability of the silicon to undergo the transformation from a high resistance state to a low resistance state during a subsequent processing stage once the silicon is reacted with titanium.

Masking the active areas during treatment 304 reduces or prevents the introduction of metallic impurities or other defects and damage into the S/D regions that may lead to higher diode junction leakage in the device being formed. This is a significant technical advantage.

Again referring to FIG. 1, in step 108, the mask is removed using known techniques. In step 110, a layer of Titanium is deposited over the semiconductor structure. The layer is then subjected to a process to form a silicide, for example, through first annealing process 112. When an annealing process is used, it is typically performed in a nitrogen ambient, so that the remaining non-silicided material is either unchanged or forms a metal nitride. In step 114, the non-silicided metal is removed. For example, a wet etch may be used to selectively remove the non-silicided metal. In the case of Ti, a solution of H$_2$O$_2$ and H$_2$O may be used to wet etch the unreacted Ti and TiN which is formed during the annealing process, thus, leaving a layer of C49 phase TiSi$_2$.

Next, second anneal 116 is performed to initiate the transformation from C49 phase TiSi$_2$ to C54 phase TiSi$_2$. For a successful transformation to occur, a sufficient number of C54 nucleation sites must be created in the TiSi$_2$. If an insufficient number of sites are present, then there will be incomplete transformation of the silicide for the given anneal conditions and the resulting layer of silicide will be a mixture of C54 and C49 phase TiSi$_2$ and will not be at its lowest possible resistance. Hence, pretreatment of the silicon with treatment 304 is desirable to increase the ability of the TiSi$_2$ to form C54 nucleation sites.

Figure 4A:
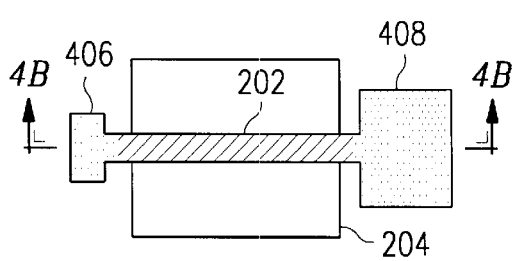
FIG. 4A represents an overhead view of a silicon structure immediately after undergoing phase transformation.
Figure 4B:
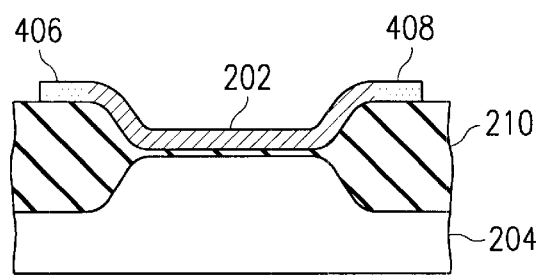
FIG. 4B represents a view of the silicon structure in FIG. 4A taken along the 4B—4B cut indicated in FIG. 4A.
Figure 5:
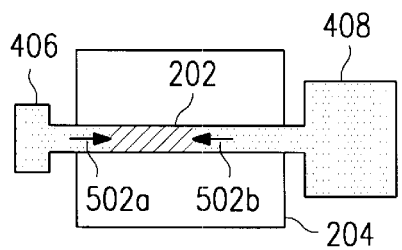
FIG. 5 represents an overhead view of a silicon structure that has undergone partial phase transformation.

Referring to FIGS. 4A, 4B, and 5, the enhanced nucleation and subsequent transformation from C49 to C54 phase silicide is illustrated. In FIGS. 4A and 4B, hammerhead 406 and contact pad 408 have both undergone an initial anneal and have a plurality of C54 nucleation sites. Such a transformation may be initiated as previously discussed by an annealing process. The transformation begins in the nucleation regions, and, as a result, at this early stage, silicon gateway 202 has not been affected and remains C49 phase TiSi$_2$. As shown in FIG. 5, however, once the nucleation regions have undergone the phase transformation to C54 phase, a phase transformation "wavefront" propagates into silicon gateway 202 from both hammerhead 406 and contact pad 408. This is indicated by phase transformation wavefronts 502a and 502b which are shown traveling along silicon gateway 202, resulting in silicon gateway 202 transforming to C54 phase TiSi$_2$.

The process results in low-resistance TiSi$_2$ in the narrow silicon structure without the deleterious effect of increased junction leakage in the S/D regions of the device.

Figure 6:
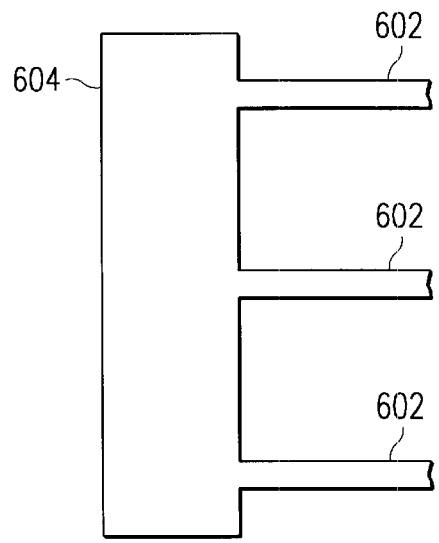
FIG. 6 represents several silicon structures according to another embodiment of the invention.

In another embodiment, more than one narrow silicon structure may be enhanced using the same nucleation regions. Referring to FIG. 6, a plurality of narrow silicon structures 602 are provided. At least one nucleation region 604 is attached to the plurality of narrow silicon structures 602. The number of nucleation regions 604 attached may depend on factors including, inter alia, the length of the narrow silicon structure, available space, and the like.

Referring back to FIG. 1, steps 104, 106 and 108 are not always desirable. The steps permit the active area (i.e., moat 204 and silicon gate 202) to be masked during treatment of the nucleation regions to enhance formation of C54 nucleation sites during silicidation. If the nucleation regions are sufficiently large, the number of C54 nucleation sites in the nucleation regions may be sufficient without additional treatment. The C49 to C54 phase transformation will also be initiated in the nucleation regions and then propagate along the narrow silicon structure. The treatment associated with step 106 may certainly enhance the formation of C54 nucleation sites, but if the nucleation region has a width of at least 0.25 $\mu$m, which represents an approximate distance between two adjacent C54 nuclei, then treatment becomes merely preferable, and no longer necessary.

Again referring to FIG. 1, step 116 may not always be desirable. The second anneal associated with step 116 may enhance the transformation from C49 to C54, but where the treatment associated with step 106 is implantation of molybdenum, the transformation from C49 to C54 will often occur before the second anneal, and therefore, the second anneal may be unnecessary. In such a case, the nucleation sites formed during the first anneal, i.e., treatment 304, may convert completely to C54 phase TiSi$_2$.

While the invention has been particularly shown and described by the foregoing detailed description, it will be understood by those skilled in the art that various other changes in form and detail may be made without departing from the spirit and scope of the invention.

What is claimed is:

1. A semiconductor device capable of undergoing a phase transformation comprising:

at least one narrow silicon structure; and at least one nucleation region attached to the at least one narrow silicon structure, said at least one nucleation region having a width which is greater than a width of said at least one narrow silicon structure and said at least one nucleation region capable of generating a high density of C54 nucleation sites such that said high density of C54 nucleation sites causes a phase transformation to propagate along the at least one silicon structure.

2. The device of claim 1, wherein the at least one narrow silicon structure is in a high resistance state prior to the phase transformation propagation and is in a low resistance state subsequent to the phase transformation propagation.

3. The device of claim 1, wherein the generation of said high density of C54 nucleation sites on the at least one nucleation region is enhanced by using pre-amorphization implantation.

4. The device of claim 1, wherein the generation of said high density of C54 nucleation sites on the at least one nucleation region is enhanced by using introduction of molybdenum.

* * * * *